United States Patent [19]

Kennedy

[11] 3,778,685

[45] Dec. 11, 1973

[54] INTEGRATED CIRCUIT PACKAGE WITH LEAD STRUCTURE AND METHOD OF PREPARING THE SAME

[75] Inventor: Bobby W. Kennedy, Arab, Ala.

[73] Assignee: The United States of America as represented by the National Aeronautics and Space Administration, Washington, D.C.

[22] Filed: Mar. 27, 1972

[21] Appl. No.: 238,047

[52] U.S. Cl....... 317/234 R, 317/234 E, 317/234 F, 317/234 M, 317/234 N

[51] Int. Cl............................. H011 3/00, H011 5/00

[58] Field of Search........................ 317/234, 3, 3.1, 317/4, 5.4, 4.1

[56] References Cited

UNITED STATES PATENTS

| | | | |
|---|---|---|---|
| 3,475,814 | 11/1969 | Santangini | 317/234 N |
| 3,659,035 | 4/1972 | Planzo | 317/234 J |
| 3,440,027 | 4/1969 | Hugle | 317/234 |
| 3,441,813 | 4/1969 | Takatsuka et al. | 317/234 |
| 3,544,857 | 12/1970 | Byrne et al. | 317/234 |
| 3,559,285 | 2/1971 | Kauffman | 317/234 |
| 3,594,619 | 7/1971 | Kamoshida | 317/234 |

OTHER PUBLICATIONS

Electrical Contact With Thermo-Compression Bonds; by Christensen, pages 127–130; April, 58.

*Primary Examiner*—John W. Huckert
*Assistant Examiner*—Andrew J. James
*Attorney*—L. D. Wofford, Jr. et al. and John R. Manning

[57] ABSTRACT

A beam-lead integrated circuit package assembly including a beam-lead integrated circuit chip, a lead frame array bonded to projecting fingers of the chip, a rubber potting compound disposed around the chip and an encapsulating molded plastic. The lead frame array is prepared by photographic printing of a lead pattern on a base metal sheet, selectively etching to remove metal between leads and plating with gold. Joining of the chip to the lead frame array is carried out by thermocompression bonding of mating gold-plated surfaces. A small amount of silicone rubber is then applied to cover the chip and bonded joints, and the package is encapsulated with epoxy resin, applied by molding.

6 Claims, 4 Drawing Figures

PATENTED DEC 11 1973 3,778,685

SHEET 1 OF 2

INTEGRATED CIRCUIT PACKAGE WITH LEAD STRUCTURE AND METHOD OF PREPARING THE SAME

ORIGIN OF THE INVENTION

The invention described herein was made by an employee of the United States Government and may be manufactured and used by or for the Government of the United States of America for governmental purposes without the payment of any royalties thereon or therefor.

BACKGROUND OF THE INVENTION

This invention relates to integrated circuits and more particularly to packaging of integrated circuit chips.

Integrated circuit technology has been developed in recent years to the extent that reliable, high-density circuits can be produced at a very low cost. The major limitation on circuit or system size, as well as the major element of overall cost, has become the circuit package. Integrated circuit packages normally require a large number of conductive leads connected to pads or contact points on the circuit chip and a protective insulating cover.

Various materials and processing techniques have been used for packaging of integrated circuit chips, but the previous approaches have generally included one or more disadvantageous features. One approach employed prefabricated metal-plastic or ceramic packages in which the chips were mounted, with small-diameter wire leads being joined to the chip and the package header by soldering. The required soldering operation is tedious and time-consuming, and solder particles can serve as a source of contamination. Other packages have been based on the use of a glass or ceramic substrate for supporting a thin film lead structure, the substrate being inverted for joining of leads to the chip. Visual inspection of lead-to-chip bonds is precluded by the presence of a substrate in this type of package, and an additional soldering or bonding step is required for connection to external leads. Still another approach has utilized a stamped-metal frame to which terminal points on the chip are joined by ultrasonic bonding. The attainable lead density in such package is limited because of the stamping or die-cutting operation. An improved integrated circuit package is needed to avoid the disadvantages of these approaches and to meet other requirements, in particular, a high-quality bond between the chip contact points and the package leads, a capability for service at higher temperatures than are attainable with soldered joints and a simple, economical fabrication process.

SUMMARY OF THE INVENTION

In the present invention an integrated circuit package assembly is made up of a beam-lead integrated circuit chip joined directly to a lead frame array by thermocompression bonding of mating gold-plated surfaces, with the chip and joint area being covered by a rubbery potting compound and encapsutated in molded plastic. The lead frame array is formed by photographically printing on a base metal sheet a pattern having inward-extending lead ends corresponding to the spacing of contact points on the chip, etching to remove metal between leads and plating with gold. After bonding the lead array to the chip, the package is completed by application of a potting compound and a molded outer cover of a plastic such as an epoxy resin. Integrated circuit packages embodying the invention are readily fabricated in a simple, low cost process, and the quality attained is high owing to the favorable characteristics of the gold-to-gold thermocompression bond and avoidance of using wire leads, ceramic substrate and soldering steps. The etched lead array enables a high lead density, and effective hermetic sealing is realized by means of the rubber and molded plastic cover.

It is therefore an object of this invention to provide an integrated circuit package assembly for beam-lead integrated circuit chips.

Another object is to provide an integrated circuit package assembly having high-quality, unsoldered connections between the circuit chip and external leads.

Still another object is to provide an integrated circuit package assembly that can be fabricated easioy at low cost.

Yet another object is to provide a method of preparing integrated circuit package assemblies.

Other objects and advantages of the invention will be apparent from the following detailed description and the appended claims.

DESCRIPTION OF THE PREFERRED EMBODIMENT

Figure 1:
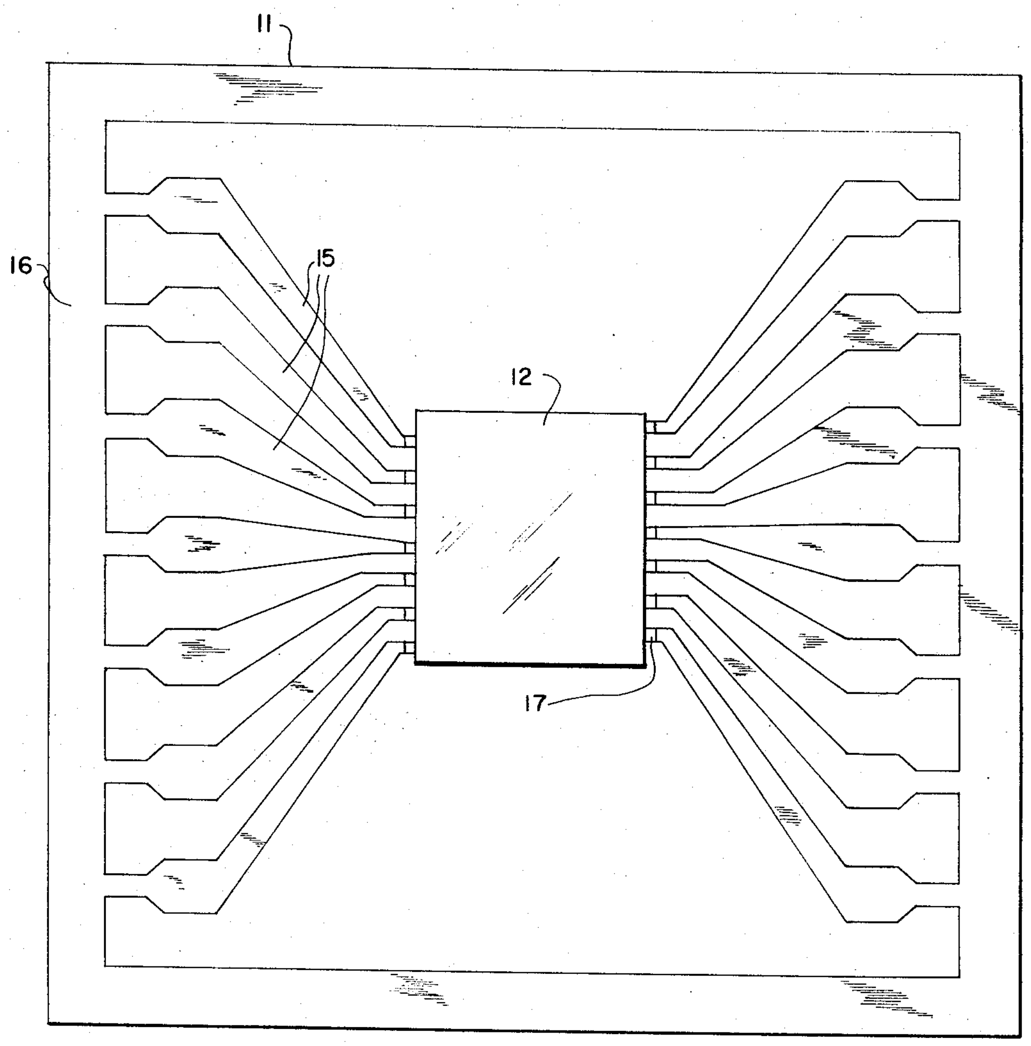
FIG. 1 is an enlarged top plan view of a partially completed integrated circuit package assembly embodying the invention.
Figure 2:
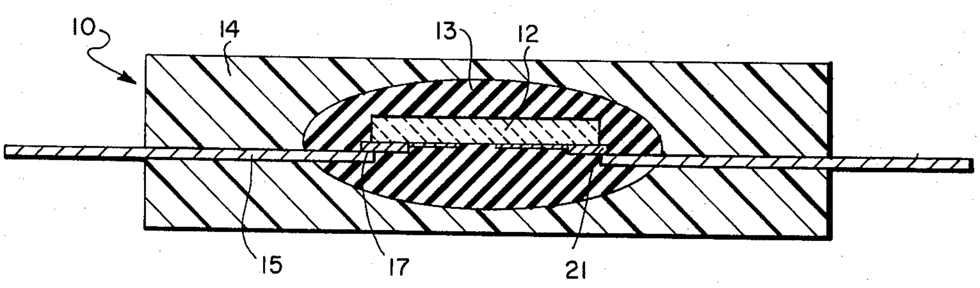
FIG. 2 is an enlarged sectional view, taken in the thickness direction, of a completed assembly.

Referring to FIGS. 1 and 2 of the drawings, there is shown an integrated circuit package assembly 10 made up of a lead frame array 11, a beam-lead integrated circuit chip 12, a rubbery potting compound 13 disposed around the chip and an outer molded plastic cover 14. The lead frame array 11 has a plurality of spaced-apart, gold-plated conductive leads 15 extending inwardly from a peripheral support frame 16 and converging closer together at their junctures with contact points 17 on the integrated circuit chip 12. The chip is disposed in the center of the space enclosed by support frame 16 and substantially coplanar with frame 16 and leads 15.

Figure 3:
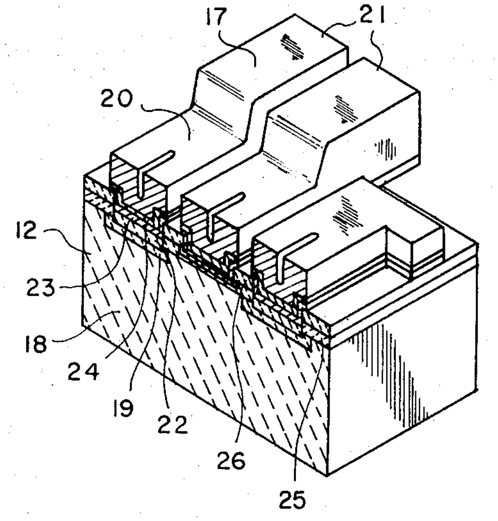
FIG. 3 is a greatly enlarged isometric view, partly in section, of a portion of a beam lead integrated chip.

FIG. 3 shows a beam-lead integrated circuit chip of the type to which the invention is especially applicable. The chip 12 has a silicon wafer base 18, within the upper surface of which a plurality of MOS junction devices 19 are provided, the junction devices having been formed by gate-growth techniques. The junction devices are joined through thin layers of various materials to a network of gold leads 20 having projecting fingers or beams 21 of increased thickness extending outward past the edge of the chip. The upper surfaces 17 of projecting beams serve as contact points for connection of the chip to leads 15 of lead frame array 11. Between the network of gold leads 20 and the junction device 19 are interposed a layer 22 of palladium silicide, a layer 23 of titanium, and a barrier layer 24 of palladium. The remainder of the upper surface of the chip is covered with a layer 25 of silicon dioxide and a passivating layer 26 of silicon nitride. Beam-lead integrated circuit chips of this type can be prepared by previously developed techniques.

As shown in FIG. 2, the projecting beams 21 of chip 12 have their surfaces 17 joined directly to leads 15 of lead frame array 11 by means of thermocompression bonding. Lead frame 11 is made of a base-metal, preferably Kovar, plated with a thin layer of gold. Minimum contact resistance is characteristic of the gold-to-gold bond, and the problems of contamination and decreased service temperature encountered with solder joints are avoided. The chip and bonded lead surfaces are encased in a rubbery potting compound 13, which is preferably a high purity, space-grade silicone rubber. This material insulates and protects the chip and bonded lead areas, and its compressibility allows for shrinkage of the outer plastic cover without damage to the chip. The molded cover 14 hermetically seals and encases the potted chip so that only leads 15 extend outward. The cover material is selected to provide a high thermal conductivity and a low coefficient of thermal expansion, consistent with a capability for being molded and other favorable properties. Although other plastic resins can be used, epoxy resins are preferred.

In preparation of the integrated circuit package, the lead frame is first formed by printing the desired pattern on a base metal sheet and selectively etching away the metal between leads. Best results are obtained by using a Kovar alloy (typical composition in weight percent: Cr, 5.75; Ni, 42.5; Si, 0.25, Mn, 0.50; C, 0.1; balance, iron) sheet about 5 mils thick. In a preferred procedure, the lead pattern artwork is laid out on a pattern generator to a one-to-one scale. The pattern is then exposed on the Kovar sheet using photolithography techniques, the sheet having been coated with a suitable photoresist. After development of the pattern the sheet is etched to remove the metal between leads. Lead frame arrays with a density up to 120 leads per chip can be obtained by this means. The etched lead frame is then plated with a thin layer of gold by conventional techniques, with a thickness of 5 microns being sufficient.

Bonding of the lead frame to the chip beams array is carried out by positioning the chip on the lead frame so that the lead ends of the array are in contact with the projecting beams of the chip and applying heat and pressure, a pressure of 100 grams and a temperature of 350° C being sufficient. The mating gold surfaces readily form a high quality bond under these conditions. Bonding can be facilitated by the use of a conventional wabble bonder. Any necessary testing for electrical function can be carried out by probing the bonds after the leads are severed from the support frame. Bonding can also be checked by visual inspection under a microscope.

After bonding, the rubbery potting compound is applied to cover the chip and bonded lead area. Normally one drop of liquid polymer is sufficient for this purpose. In order to avoid deposition of potting compound on the remaining portion of the leads, the lead frame is preferably masked off with Teflon tape prior to application of the potting compound. In the absence of such measure, small amounts of silicone on the leads would function as a release agent and prevent adhesion of the molding resin. The potting compound is of course allowed to cure, which occurs within five minutes in the case of silicones, prior to further processing.

The package assembly is completed by application of a molded plastic cover. This operation is readily carried out by use of conventional injection or transfer molding techniques.

Figure 4:
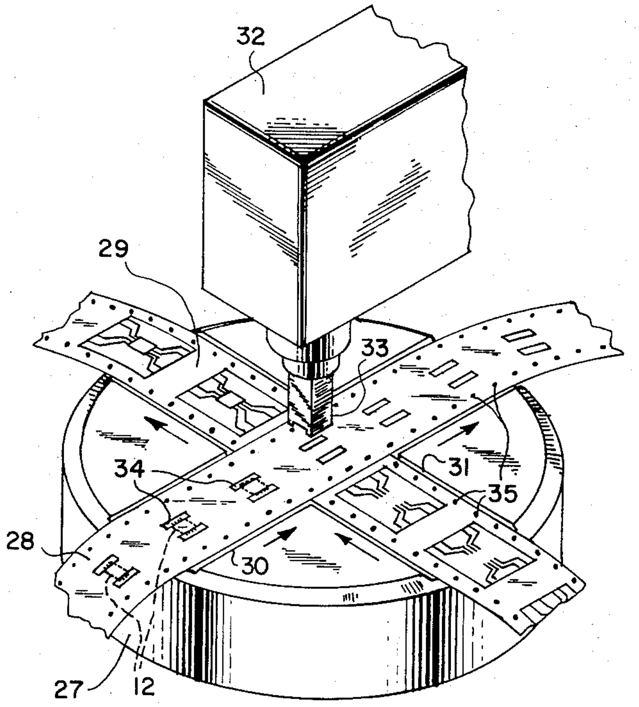
FIG. 4 is a perspective view of apparatus for automatically bonding integrated circuit chips to lead frame arrays.

By adapting the process described above, fabrication of in tegrated circuit chip package assemblies embodying the invention can be accomplished automatically to provide increased reliability and decreased costs. An apparatus which can be used for this purpose is shown in part in FIG. 4. The apparatus includes a stationary base member 27 having a substantially flat upper surface over which plastic tapes 28 and 29 are adapted to move, tape 28 crossing over tape 29 at the center of the upper surface of the base member. Tape 28 has lightly affixed to its underside beam lead integrated circuit chips 12 as shown in FIG. 3. Tape 29 has affixed to its upper surface lead frame arrays 11 as described above. The tapes are adapted to intersect so that beams leads of the chips are brought into alinement with leads of the lead frame array. Base member 27 has radially extending grooves 30 and 31 within which tapes 28 and 29 are maintained in alinement. A vertically movable head 32 having a downwardly projecting bonding member 33 is disposed over the point of intersection of the two tapes. Tape 28 is penetrated by holes 23 over the beam leads of the chips 12 so as to allow bonding member 33 to make metal-to-metal contact and effect bonding upon being forced downward. The tapes 28, 29 have holes 35 to enable controlled advancement by engagement with fingers of a suitable sprocket or reel (not shown). Bonding members 33 is provided with suitable means (not shown) for attaining the desired temperature and pressure for bonding. Head 32 is controlled so as to move downward upon advancement of each successive chip and lead frame array to alined position at the integration of the tapes.

While the invention is described above will respect to a particular embodiment, it is to be understood that various changes and modifications may be made by one skilled in the art without departing from the invention.

I claim:

1. An integrated circuit package assembly comprising:

a. an integrated circuit chip having a semiconductor body and a plurality of spaced-apart precious metal fingers deposited on said body and extending outward slightly from the periphery of the body, flat surfaces of said fingers forming a coplanar array of elevated contact surfaces;

an array of spaced-apart, gold-plated sheet metal leads of substantially uniform thickness formed by printing a lead pattern on a base metal sheet, selectively etching away the metal between leads and plating with gold;

c. each of said leads having one end portion thereof joined directly to one of said contact surfaces by thermo-compression bonding;

d. a rubbery potting compound encapsulating said chip and the bonded end portions of said leads; and e. a molded plastic cover enclosing the encapsulated chip, said leads extending through said cover and being adapted to mate with external electrical connectors.

2. The assembly of claim 1 wherein said rubbery potting compound is a silicone polymer.

3. The assembly of claim 2 wherein said molded plastic is an epoxy resin.

4. The assembly of claim 3 wherein said base metal sheet is a Kovar alloy.

5. The assembly of claim 4 wherein said base metal sheet is about 5 mils thick.

6. The assembly of claim 5 wherein the gold plating on said base metal sheet is about 5 microns thick.

* * * * *